United States Patent [19]

Kikuchi et al.

[11]  4,288,804
[45]  Sep. 8, 1981

[54] COMPLEMENTARY METAL-OXIDE SEMICONDUCTOR

[75] Inventors: Hideo Kikuchi, Yokohama; Haruyoshi Takaoka; Shigenori Baba, both of Kawasaki, all of Japan

[73] Assignee: Fujitsu Limited, Kanagawa, Japan

[21] Appl. No.: 102,017

[22] Filed: Dec. 10, 1979

[30] Foreign Application Priority Data

Dec. 27, 1978 [JP] Japan .............................. 53/164997

[51] Int. Cl.$^3$ .............................................. H01L 27/02
[52] U.S. Cl. ...................................... 357/42; 357/41; 357/23; 357/48; 357/89
[58] Field of Search ................... 357/41, 23, 89, 42, 357/48

[56] References Cited

U.S. PATENT DOCUMENTS

| | | | |
|---|---|---|---|
| 3,955,210 | 5/1976 | Bhatia | 357/42 |
| 4,161,417 | 7/1979 | Yim | 148/175 |
| 4,167,747 | 9/1979 | Saton | 357/42 |
| 4,173,767 | 11/1979 | Stevenson | 357/44 |

Primary Examiner—Martin H. Edlow
Attorney, Agent, or Firm—Staas & Halsey

[57] ABSTRACT

A complementary metal-oxide semiconductor comprises at least one P channel MOSFET and at least one N channel MOSFET. In the semiconductor at least one additional doped portion is formed close to at least one of the P and N channel MOSFETs at a small part of the region which is driven by the voltage supply. The additional doped portion is directly connected to the voltage supply.

13 Claims, 8 Drawing Figures

COMPLEMENTARY METAL-OXIDE SEMICONDUCTOR

BACKGROUND OF THE INVENTION

1. Field of the Invention

The present invention relates to a complementary metal-oxide semiconductor fabricated as an integrated circuit.

2. Description of the Prior Art

The complementary metal-oxide semiconductor is widely known by the abbreviated term CMOS. The CMOS is a combination of N- and P-channel enhancement-mode devices mounted on a single silicon chip. The advantages thereof include low quiescent power dissipation and high operating speed.

In the conventional CMOS structure, a P channel device is formed in an N⁻ layer, that is an N-substrate and an N channel device is formed in a P layer which is contained in a part of the N-substrate and is called a P-well. In a highly integrated circuit such devices are separated from one another by no more than a few microns, and a four region PNPN structure is thereby formed in the single silicon chip. This PNPN structure may function as a parasitic silicon-controlled rectifier, that is, an SCR. However, since the SCR remains turned on when external electric noise is applied thereto and maintains a latched status until the anode voltage is removed therefrom, a malfunction occurs in the CMOS or, in the worst case, the CMOS is damaged by a very large short-circuit current flowing through the parasitic SCR. This fact has already been known as the so-called latchup phenomenon.

In the prior art, firstly, a CMOS device which can eliminate the above mentioned latchup phenomenon has been proposed in U.S. Pat. No. 3,955,210. The structural feature of this prior art CMOS is represented by a guard region. Secondly, a CMOS device which can eliminate the above mentioned latchup phenomenon has also been known in the technical field to which the present invention pertains. The structural feature of this latter CMOS is represented by a first heavily doped P+ region formed in the P-well, as well as the N+ regions which act as source and drain, and a second heavily doped N+ region formed in the N-substrate, as well as the P+ regions which act as the other source and drain.

The above mentioned two kinds of prior art CMOSs are useful for eliminating the respective latchup phenomena. However, each of these CMOSs has a defect in that the CMOS becomes relatively large in size due to the presence of the above mentioned guard region or the first and second heavily doped regions. Accordingly, it is difficult to fabricate the very highly integrated circuits in the single silicon chip.

SUMMARY OF THE INVENTION

Therefore, it is an object of the present invention to provide a CMOS which can eliminate the latchup phenomenon without increasing the size of the CMOS.

BRIEF DESCRIPTION OF THE DRAWINGS

The present invention will be more apparent from the ensuing description with reference to the accompanying drawings wherein.

DETAILED DESCRIPTION OF THE DRAWINGS

Figure 1:
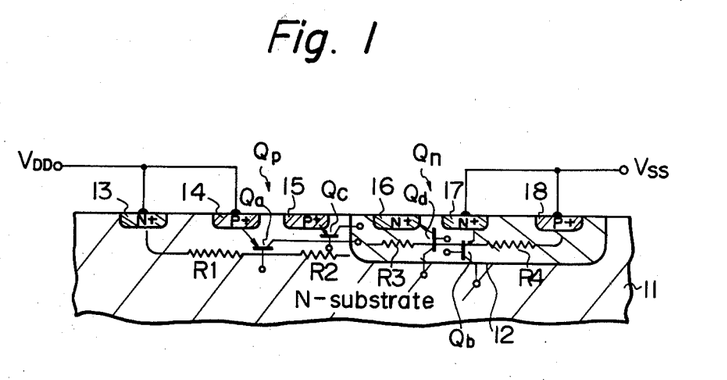
FIG. 1 illustrates a cross sectional view of a typical CMOS.

FIG. 1 illustrates in cross sectional view a typical CMOS in an N-substrate 11. A P-well 12 is contained in part of the N-substrate 11. A voltage potential $V_{DD}$, that is a drain supply voltage, is applied to the N-substrate 11 via an N+ region 13 which serves as a contact to the N-substrate 11. Both a P+ region 14 and a P+ region 15 serve, respectively, as a source and a drain of a P channel MOSFET (MOS fieldeffect transistor) $Q_p$. The gate of the MOSFET $Q_p$ and conventional insulation layers are not shown in FIG. 1. A voltage potential $V_{SS}$, that is a source supply voltage, is applied to the P-well 12 via a P+ region 18 which serves as a contact to the P-well 12. Both an N+ region 16 and an N+ region 17 serve, respectively as a drain and a source of an N channel MOSFET $Q_n$. The gate of the MOSFET $Q_n$ and conventional insulation layers are not shown in FIG. 1. Thus, the CMOS is comprised of the MOSFETs $Q_p$ and $Q_n$ connected in series, and these MOSFETs are connected between one voltage supply ($V_{DD}$) and another voltage supply ($V_{SS}$).

Since many P+ regions such as the regions 14 and 15 and also other P+ regions (not shown) and many N+ regions such as the regions 16 and 17 and also other N+ regions (not shown), are formed in the N-substrate 11 and the P-well 12, respectively, various kinds of parasitic bipolar devices are created in the single silicon chip on which the MOSFETs $Q_p$ and $Q_n$ and also other logic devices (not shown) are mounted. For example, parasitic PNP and NPN transistors are created in the silicon ship. The parasitic PNP transistors are schematically indicated by symbols of transistors $Q_a$ and $Q_c$ and the parasitic NPN transistors are schematically indicated by symbols of transistors $Q_b$ and $Q_d$. The reference symbols $R_1$ and $R_2$ represent resistive components (resistors) of the N-substrate 11 itself. The reference symbols $R_3$ and $R_4$ represent resistive components (resistors) of the P-well 12 itself.

Figure 2:
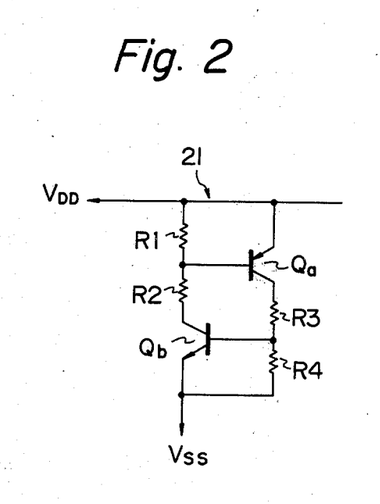
FIG. 2 shows an equivalent circuit diagram of a first parasitic SCR created in a single silicon chip.
Figure 3:
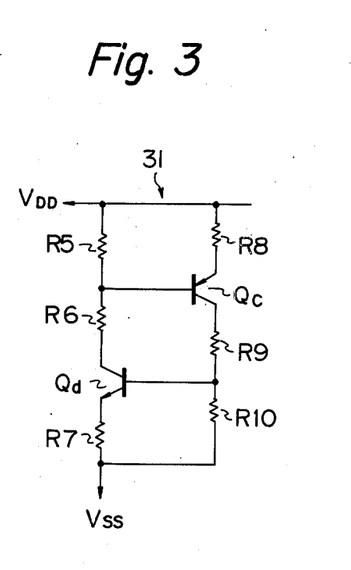
FIG. 3 shows an equivalent circuit diagram of a second parasitic SCR created in the single silicon chip.

The parasitic PNP transistor $Q_a$ and the parasitic NPN transistor $Q_b$ of FIG. 1 together form a first parasitic circuit having an equivalent circuit diagram as shown in FIG. 2. Also, the parasitic PNP transistor $Q_c$ and the parasitic NPN transistor $Q_d$ of FIG. 1 together form a second parasitic circuit having an equivalent circuit diagram as shown in FIG. 3. Resistors $R_5$ through $R_{10}$ shown in FIG. 3 will be explained hereinafter with reference to FIG. 8. Referring to FIG. 2, the emitter of the parasitic transistor $Q_a$ exists in the P+ region 14 shown in FIG. 1, and the emitter of the parasitic transistor $Q_b$ exists in the N+ region 17 shown in FIG. 1. The base of the transistor $Q_a$ exists in the N-substrate 11 shown in FIG. 1 and the base of the transistor $Q_b$ exists in the P-well 12 shown in FIG. 1. The collector of the transistor $Q_a$ exists in the P-well 12 and the collector of the transistor $Q_b$ exists in the N-substrate 11. In the first parasitic circuit 21, if an external electric noise is applied to the transistor $Q_a$ and the transistor $Q_a$ is slightly turned on due to the external electric noise, a relatively low collector current of the transistor $Q_a$ flows through the resistors $R_3$ and $R_4$. Then the transistor $Q_b$ is biased by the voltage developed at the junction of the resistors $R_3$ and $R_4$. Therefore, the transistor $Q_b$ is also slightly turned on. Then a relatively low collector current of the transistor $Q_b$ flows through the resistors $R_1$ and $R_2$. Accordingly, the transistor $Q_b$ is biased by the voltage developed at the junction of the resistors $R_1$ and $R_2$, and the transistor $Q_a$ is caused to be fully turned on, which causes the transistor $Q_b$ to be fully turned on. Thus, both the transistors $Q_a$ and $Q_b$ are finally led to their respective saturation conditions. The saturation conditions will be maintained until the voltage supply ($V_{DD}$ and/or $V_{SS}$) is removed from the first parasitic circuit 21. Thus, the latchup phenomenon occurs in the circuit 21. It should be understood that the latchup phenomenon occurs due to the fact that the circuit 21 is constructed as a parasitic SCR.

Now the technical idea of the present invention for eliminating the parasitic SCR from the single semiconductor chip will be explained in detail. Referring still to FIG. 2, the transistor $Q_b$ is biased by means of the combination of the resistors $R_3$ and $R_4$, and similarly the transistor $Q_a$ is biased by means of the combination of the resistors $R_1$ and $R_2$. Accordingly, it should be noticed that if the resistor $R_4$ is removed from the chip, the transistor $Q_b$ can not be turned on. This is because, if there is no such resistor $R_4$, there is no increase of the voltage level at the base of the transistor $Q_b$, and thereby the transistor $Q_b$ cannot be biased. Similarly, if the resistor $R_1$ is removed from the chip, the transistor $Q_a$ cannot be turned on. This is because, if there is no such resistor $R_1$, there is no decrease of the voltage level at the base of the transistor $Q_a$, and thereby the transistor $Q_a$ cannot be biased. Since the transistors $Q_a$ and $Q_b$ cooperate with each other for comprising the parasitic SCR, the parasitic SCR may lose its natural latch-up function if at least one of the resistors $R_1$ or $R_4$ is removed from the chip. However, it is preferable to remove both resistors $R_1$ and $R_4$ therefrom at the same time.

For the purpose of removing the resistors $R_1$ and/or $R_4$ from the single silicon chip, in the present invention, additional doped portions are formed therein. The additional doped portions are used for reducing the resistance values of the resistors $R_1$ and/or $R_4$ to values being substantially equal to zero. In FIG. 1, since the resistance value of the resistor $R_1$ may be defined by the length of the distance between the N+ region 13 having a voltage potential of $V_{DD}$ and the parasitic PNP transistor $Q_a$ formed in and close to the P channel MOSFET $Q_p$, the resistance value of the resistor $R_1$ can be reduced to a value being substantially equal to zero by introducing a first additional doped portion which is connected to the voltage supply ($V_{DD}$), into a part located in or near the source of the P channel MOSFET. In this case, the first additional doped portion must be doped so as to have the same conductivity as that of the N-substrate 11. Similarly, in FIG. 1, since the resistance value of the resistor $R_4$ may be defined by the length of the distance between the P+ region 18 having the voltage potential of $V_{SS}$ and the parasitic NPN transistor $Q_b$ formed in and close to the N channel MOSFET $Q_n$, the resistance value of the resistor $R_4$ can be reduced to a value substantially equal to zero, by introducing a second additional doped portion which is connected to the voltage supply ($V_{SS}$), into a part located in the source of the N channel MOSFET. In this case, the second additional doped portion must be doped so as to have the same conductivity as that of the P-well 12.

Figure 4:
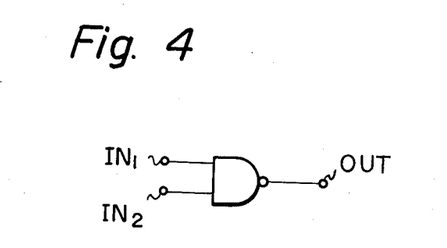
FIG. 4 illustrates a logic symbol indicating a typical two-input NAND logic gate.
Figure 5:
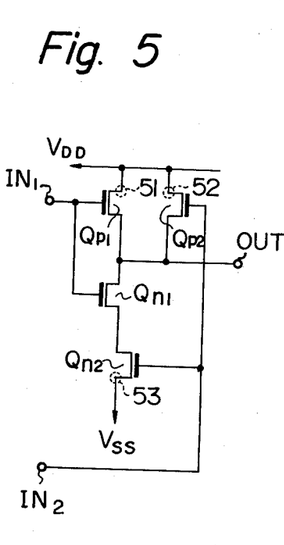
FIG. 5 shows a circuit diagram of P and N channel MOSFETs which are comprised of the two-input NAND logic gate.
Figure 6:
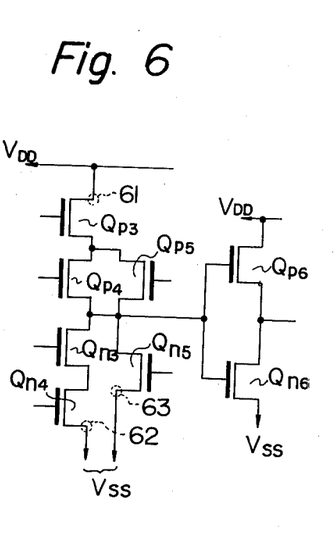
FIG. 6 shows a circuit diagram of P and N channel MOSFETs which comprise another logic gate.

The above mentioned first and second additional doped portions will be clarified with reference to FIGS. 4, 5, 6 and 7, by taking a two-input NAND logic gate as an example. FIG. 4 illustrates a logic symbol indicating a typical twoinput NAND logic gate. The two-input NAND logic gate can be fabricated by the CMOS which has a circuit diagram as shown in FIG. 5. In FIG. 5, the CMOS is fabricated by P-channel MOSFETs $Q_{p1}$ and $Q_{p2}$ and N-channel MOSFETs $Q_{n1}$ and $Q_{n2}$. Each of the P-channel MOSFETs $Q_{p1}$ and $Q_{p2}$ has substantially the same semiconductor structure as shown by the P-channel MOSFET $Q_p$ in FIG. 1 and also each of the N-channel MOSFETs $Q_{n1}$ and $Q_{n2}$ has substantially the same semiconductor structure as shown by the N-channel MOSFET $Q_n$ in FIG. 1. The reference symbols $IN_1$ and $IN_2$ represent the two inputs (see FIG. 4) of the NAND logic gate. The reference symbol OUT represents the output (see FIG. 4) thereof. In FIG. 5, the above mentioned first additional doped portion is formed at a position, surrounded by a dotted circle 51, corresponding to the source of the MOSFET $Q_{p1}$. The identical first additional doped portion is also formed at a position, surrounded by a circle 52, corresponding to the source of the MOSFET $Q_{p2}$. On the other hand, the above mentioned second additional doped portion is formed at a position, surrounded by a dotted circle 53, corresponding to the source of the MOSFET $Q_{n2}$. Thus, the additional doped portion is entered into at least one MOSFET at the part which is driven by the voltage supply. Preferably, the additional doped portions are entered into the MOSFETs which are driven, at their respective parts, by the voltage supplies ($V_{DD}$, $V_{SS}$). Therefore, in FIG. 5, the MOSFET $Q_{n1}$ does not employ such additional doped portion therein. This is because, the source of the MOSFET $Q_{n1}$ is driven by neither the voltage supply ($V_{DD}$) nor the voltage supply ($V_{SS}$). The reason why it is not necessary for the MOSFET $Q_{n1}$ to employ such an additional doped portion will be explained hereinafter with reference to FIGS. 3 and 6. Accordingly, referring to another example, if the present invention is applied to CMOS logic devices having a circuit diagram such as shown in FIG. 6, the first additional doped portion is formed at the source, surrounded by a dotted circle 61, of a P channel MOSFET $Q_{p3}$, and the second additional doped portions are formed at respective sources, surrounded by dotted circles 62 and 63, of N channel MOSFETs $Q_{n4}$ and $Q_{n5}$. Since P channel MOSFETs $Q_{p4}$ and $Q_{p5}$ are not driven by the voltage supply ($V_{DD}$), no such first additional doped portion is required therein. Similarly, since the N channel MOSFET $Q_{n3}$ is not driven by the voltage supply ($V_{SS}$), no such additional doped portion is required therein. Both P channel MOSFET $Q_{p6}$ and N channel MOSFET $Q_{n6}$ comprise a conventional output buffer stage.

Figure 7:
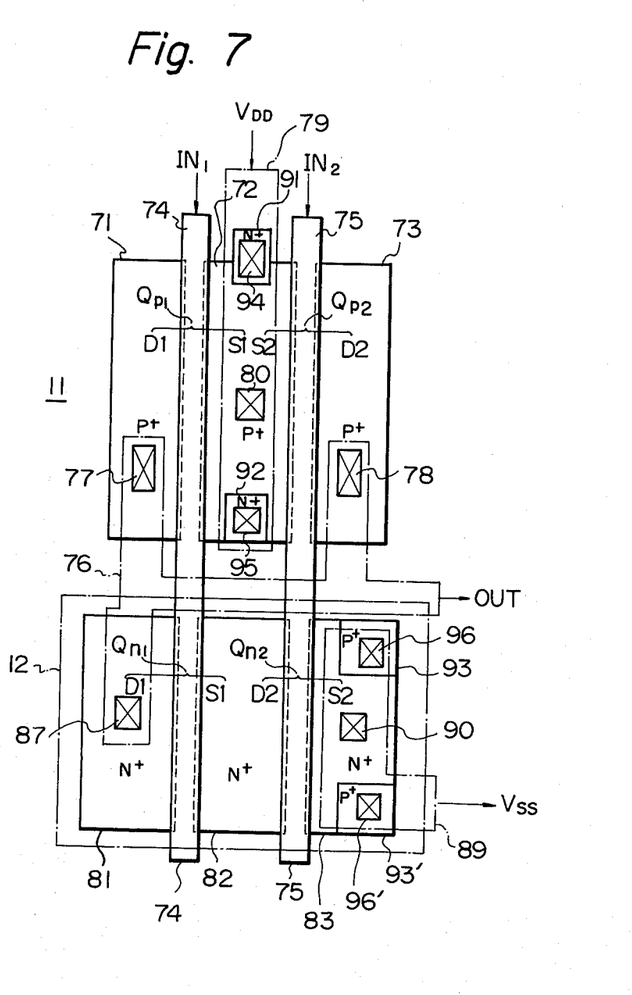
FIG. 7 illustrates an actual plan view of a CMOS device which comprise of the two-input NAND logic gate shown in FIGS. 4 and 5.

The present invention will be clarified with reference to FIG. 7. FIG. 7 illustrates in actual plan view a CMOS device comprising the two-input NAND gate shown in FIGS. 4 and 5, including the area of the N-substrate 11 (refer to the N-substrate 11 in FIG. 1) and the area of the P-well 12 (refer to the P-well in FIG. 1). In the N-substrate 11, P+ regions 71, 72 and 73 (refer to the P+ regions 14 and 15 in FIG. 1) are formed. The P+ region 71 serves as the drain D1 of the P channel MOSFET $Q_{p1}$ (refer also to FIG. 5). The P+ region 72 serves as the source S1 of the MOSFET $Q_{p1}$ and, at the same time as the source S2 of the P channel MOSFET $Q_{p2}$ (refer also to FIG. 5). The P+ region 73 serves as the drain D2 of the MOSFET $Q_{p2}$. The gate of the MOSFET $Q_{p1}$ is mounted on each part of the p+ regions 71 and 72 and also on the area adjacent to both P+ regions 71 and 72, which gate 74 is made of polysilicon, and serves as one input $IN_1$ (refer also to FIGS. 4 and 5). The gate of the MOSFET $Q_{p2}$ is mounted on each part of the P+ regions 72 and 73 and also on the area adjacent to both P+ regions 72 and 73, which gate 75 is made of polysilicon, is and serves as the other input $IN_2$ (refer also to FIGS. 4 and 5). Output electrode 76 which serves as the output OUT (refer also to FIGS. 4 and 5) is mounted on the P+ region 71 and electrically connected thereto via a contact window 77. The output electrode 76 is also mounted on the P+ region 73 and electrically connected thereto via a contact window 78. Voltage supply line 79 having the voltage potential of $V_{DD}$ (refer also to FIG. 5) is mounted on the P+ region 72. The voltage potential $V_{DD}$ is applied to the P+ region 72 via a contact window 80.

In the P-well 12, N+ regions 81, 82 and 83 (refer to the N+ regions 16 and 17 in FIG. 1) are formed. The N+ region 81 serves as the drain D1 of the N channel MOSFET $Q_{n1}$ (refer also to FIG. 5). The N+ region 82 serves as the source S1 of the MOSFET $Q_{n1}$ and, at the same, as the drain D2 of the N channel MOSFET $Q_{n2}$ (refer also to FIG. 5). The N+ region 83 serves as the source S2 of the MOSFET $Q_{n2}$. The gate 74 of the MOSFET $Q_{n1}$ is mounted on each part of the N+ regions 81 and 82 and also on the area adjacent to both N+ regions 81 and 82. The gate 75 of the MOSFET $Q_{n2}$ is mounted on each part of the N+ regions 82 and 83 and also on the area adjacent to both N+ regions 82 and 83. The output electrode 76 is mounted on the N+ region 81 and is electrically connected thereto via a contact window 87. Voltage supply line 89 having the voltage potential of $V_{SS}$ (refer also to FIG. 5) is mounted on the N+ region 83. The voltage potential $V_{SS}$ is applied to the N+ region 83 via a contact window 90.

In the semiconductor structure of FIG. 7, the above mentioned first and second additional doped portions according to the present invention, are further employed therein. One of the first additional doped portions (see 51 in FIG. 5) is formed as an N region or N+ region 91 close to the P channel MOSFET $Q_{p1}$ (and also $Q_{p2}$). The region 91 has the same conductivity as that of the N-substrate 11 and further is directly connected to the voltage supply line 79 via a contact window 94. Another of the first additional doped portions (see 52 in FIG. 5) is formed as an N region or N+ region 92 close to the P channel MOSFET $Q_{p2}$ (and also $Q_{p1}$). The region 92 has the same conductivity as that of the N-substrate 11 and further is directly connected to the voltage supply line 79 via a contact window 95. Similarly, the second additional doped portion (see 53 in FIG. 5) is formed as a P region or P+ region 93 (and 93'). The region 93 (and also 93') has the same conductivity as that of the P-well 12 and further is directly connected to the voltage supply line 89 via a contact window 96 (and also 96'). Thus, the values of the resistors R1 and R4 shown in FIGS. 1 and 2 are reduced to a value substantially equal to zero due to the presence of the first and second additional doped portions, that is the regions 91, 92, 93 and 93'. Further it should be noted that since the additional regions 91, 92, 93 and 93' are not formed far from the P and N channel MOSFETs but close to the same, the CMOS device does not become larger in size compared to the size of typical CMOS device which includes no means for eliminating the latchup phenomenon therefrom.

Furthermore, it should also be noted that since some parts of the N+ region 83 and the P+ region 72 are cut off so as to form recessed portions therein, and the additional regions 91, 92 and 93, 93' are introduced therein, the size of the CMOS device does not increase compared to the size of a typical CMOS device which includes no means for eliminating the latchup phenomenon therefrom.

Figure 8:
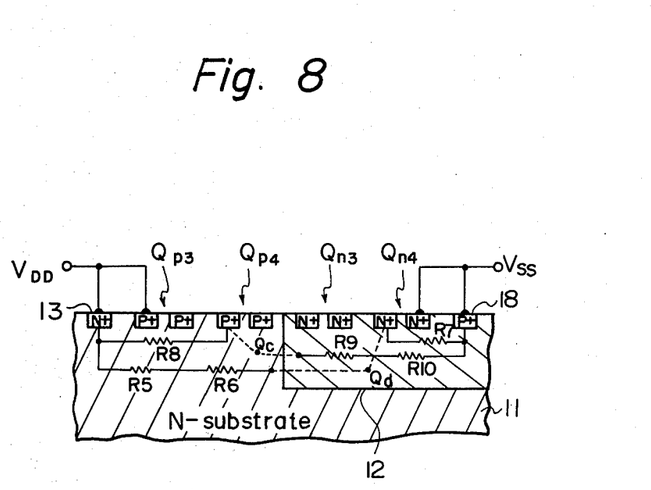
FIG. 8 illustrates a cross sectional view of mainly the MOSFETs $Q_{p3}$, $Q_{p4}$, $Q_{n3}$ and $Q_{n4}$ shown in FIG. 6.

As previously mentioned, the MOSFETs which are not driven by the voltage supply ($V_{DD}$, $V_{SS}$), such as the MOSFET $Q_{n1}$ shown in FIG. 5 and the MOSFETs $Q_{p4}$, $Q_{p5}$, $Q_{n3}$ and $Q_{n5}$ shown in FIG. 6, require no such first and second additional doped portions to be employed therein. The reason for this fact will be explained by taking the MOSFETs $Q_{p3}$, $Q_{p4}$, $Q_{n3}$ and $Q_{n4}$ of FIG. 6 as an example. In FIG. 8, which illustrates a cross sectional view of a semiconductor structure comprising MOSFETs $Q_{p3}$, $Q_{p4}$, $Q_{n3}$ and $Q_{n4}$ shown in FIG. 6, the members which are represented by the same reference numerals and symbols shown in FIG. 1, are identical with each other. Resistors R5 and R6 represent resistive components of the N-substrate 11, which resistive components cooperate with the parasitic NPN transistor $Q_d$, at its collector (refer also to FIG. 1). The transistor $Q_d$ is connected, at its emitter, to the voltage supply ($V_{SS}$) via a resistor R7. This emitter corresponds to an N+ region acting as the drain of the MOSFET $Q_{n4}$. Resistors R9 and R10 represent resistive components of the P-well 12, which resistive components cooperate with the parasitic PNP transistor $Q_c$ at its collector (refer also to FIG. 1). The transistor $Q_c$ is connected, at its emitter, to the voltage supply ($V_{DD}$) via a resistor R8. This emitter corresponds to a P+ region acting as the source of the MOSFET $Q_{p4}$. The equivalent circuit of the parasitic transistors $Q_c$, $Q_d$ and the resistors R5 through R10 has already been disclosed in FIG. 3. As seen from FIGS. 2 and 3, the circuit diagram of FIG. 3 is similar to that of FIG. 2, and accordingly, it will be considered, at a glance, that the circuit diagram of FIG. 3 may also constitute the parasitic SCR. However, this parasitic SCR does not create the aforesaid latchup phenomenon. This is because the transistor $Q_c$ is provided with, at its emitter, the resistor R8. Also, the transistor $Q_d$ is provided with, at its emitter, the resistor R7. Resistors which are similar to these resistors R7 and R8, are not presented in the parasitic SCR of FIG. 2. These resistors R7 and R8 function to prevent the circuit of FIG. 3 from operating as the SCR. In a case where an external electric noise is applied to the transistor $Q_c$ and the transistor $Q_c$ is turned on, the collector current thereof flows through the resistors R9 and R10. Then the transistor $Q_d$ is biased and turned on. However, the transistor $Q_d$ is not fully biased due to the increase of the emitter voltage of the transistor $Q_d$. The increase of the emitter voltage is obtained by a voltage drop developed across the resistor R7 when the emitter current flows therethrough. Thus, the resistor R7 acts to create a negative feedback in the SCR. Similarly, the resistor R8 also acts to create a negative feedback therein. In short, the voltage drop developed across the resistor R5 is cancelled by the voltage drop developed across the resister R8, and accordingly the transistor $Q_c$ cannot fully be biased. As explained above, since the MOSFETs, which are not driven by the voltage supplies, accompany the parasitic transistors $Q_c$ and $Q_d$ (see FIG. 3), no parasitic active SCR is created. Accordingly, no such first and second additional doped portions are required to be employed in such MOSFETs.

According to the present invention, the following three advantages are produced.

(1) A malfunction and damage due to the presence of the latchup phenomenon can be eliminated from a CMOS device.

(2) Said malfunction and damage can be eliminated from a CMOS device without enlarging the size of the CMOS device. This is because, firstly, the additional regions are not formed outside the P and N channel MOSFETs but inside the same, and secondly, recessed portions are formed in the regions of the MOSFETs themselves so as to introduce the additional regions therein.

(3) The CMOS designer can easily design a very highly integrated circuit of CMOS devices. The reason of this fact is as follows. Generally, a great number of P channel MOSFETs are fabricated in the N-substrate of one silicon chip and also a great number of N channel MOSFETs are fabricated in the P-well of the same silicon chip. In the prior art, when the CMOS designer designed the arrangement of said great number of the P and N channel MOSFETs, he had to also design, at the same time, the arrangement of areas which function to eliminate the parasitic SCR, besides the design of the arrangement of the MOSFETs themselves. In recent years, a unique method for determining the layout of logic gates in an integrated circuit has been proposed. In this method, each of the logic gates is formed as a semiconductor cell comprised of MOSFETs. However, in the prior art, when it was required to employ a means for eliminating the latchup phenomenon from the semiconductor cell, the designer had to modify the layout of the logic gates. Contrary to the above, in the present invention, it is not necessary for him to modify the layout of logic gates. That is, in the present invention, it is not necessary for him to design the arrangement of areas which function to eliminate the parasitic SCR, besides the design of the arrangement of the MOSFETs themselves. This is because, in the present invention, such areas which function to eliminate the parasitic SCR can be included in every MOSFET itself independently, as shown by the regions 91, 92 and 93 (93') in FIG. 7.

What is claimed is:

1. In a field effect transistor device which includes a first portion of a substrate having a first type of conductivity, a second portion of the substrate having a second type of conductivity opposite to the first conductivity type and being contained in the first substrate portion, at least one first channel field-effect transistor formed in the second substrate portion and provided with two first regions each having the first conductivity type which act as the source and the drain thereof, at least one second channel field-effect transistor in the first substrate portion with two second regions each having the second conductivity type which act as the source and the drain thereof, a first voltage supply which applies a first voltage potential to the first substrate portion and to a selected one of said second regions of at least one of said second field-effect transistor(s) and a second voltage supply which applies a second voltage potential to the second substrate portion and to a selected one of said first regions of at least one of said first field-effect transistors, the configuration of selected ones of said two regions of each of said first and second substrate portions and said first and second substrate portions comprising at least one parasitic bipolar transistor, the improvement comprising:

at least one additional doped portion in a respective selected one of said first and second substrate portions and having the same conductivity type as the respective substrate portion in which it is formed, formed at a position sufficiently close to a respective region of the respective field-effect transistor that is directly connected to the respective voltage supply so as to reduce effectively to zero the resistance biasing the base of said at least one parasitic bipolar transistor that is associated with the respective second region that is directly connected to the respective voltage supply, each said additional doped portion being directly connected to the respective voltage supply.

2. A semiconductor device as set forth in claim 1 comprising a first one of said additional doped portion(s) having the first conductivity type formed in the first substrate portion, at a position close to the one of said second regions of the second field-effect transistor, which is directly connected to the first voltage supply, the first additional doped portion being directly connected to the first voltage supply.

3. A semiconductor device as set forth in claim 2, wherein said second region connected to said first voltage supply has a recessed portion wherein is formed said first additional doped portion.

4. A semiconductor device as set forth in claim 1 comprising a first one of said additional doped portion(s) having the second conductivity type formed in the second substrate portion, at a position close to the one of said first regions of the first field-effect transistor which is directly connected to the second voltage supply, the first additional doped portion being directly connected to the second voltage supply.

5. A semiconductor device as set forth in claim 4, wherein said first region connected to said second voltage supply has a recessed portion wherein is formed said first additional doped portion.

6. A semiconductor device as set forth in claim 1 including both a first and a second one of said additional doped portions, said device comprising
the first additional doped portion having the first conductivity type formed in the first substrate portion, close to the second region of a selected one of the second field-effect transistor(s) which is connected to the first voltage supply, the first additional doped portion being directly connected to the first voltage supply,
the second additional doped portion having the second conductivity type formed in the second substrate portion, close to the first region of a selected one of the first field-effect transistor(s) which is connected to the second voltage supply, the second additional doped portion being directly connected to the second voltage supply.

7. A semiconductor device as set forth in claim 6, wherein the second and first regions close to which said additional doped portions are located have respective recessed portions wherein the first and second additional doped portions respectively fit.

8. A semiconductor device as set forth in claim 2, wherein the first additional doped portion is heavily doped so as to have good conductivity of said first type.

9. A semiconductor device as set forth in claim 4, wherein the first additional doped portion is heavily doped so as to have good conductivity of the second type.

10. A semiconductor device as set forth in claim 6, wherein both additional doped portions are heavily doped so as to have good conductivities of said first and second types, respectively.

11. A semiconductor device as set forth in claim 1, 2, 4 or 6 wherein the semiconductor device is fabricated as an integrated circuit which has many kinds of highly integrated complementary logic gates and plural voltage supplies connected to respective regions of said gates, each of the logic gates comprising at least one MOSFET, with at least one of said at least one MOSFET having one of said regions connected directly to one of said voltage supplies having one of said additional doped portions located within a recessed portion at the boundary of the respective region, said location of each said additional doped region in the respective substrate region directly connected to one of said voltage supplies comprising means for providing said high integration density.

12. The device of claim 11, comprising at least one of said MOSFET's connected in series between two others of said MOSFET's having said regions directly connected to said voltage supplies.

13. The device of claim 12 comprising at least two of said MOSFET's connected in series between said MOSFET's that are directly connected to respective voltage supplies.

* * * * *

UNITED STATES PATENT AND TRADEMARK OFFICE
CERTIFICATE OF CORRECTION

PATENT NO. : 4,288,804
DATED : 8 September 1981
INVENTOR(S) : HIDEO KIKUCHI et al.

It is certified that error appears in the above—identified patent and that said Letters Patent is hereby corrected as shown below:

Front page, [73] Assignee, the province "Kanagawa" should be changed to the city --Kawasaki--;
[56] References Cited, "Bhatia" should be --Bhatia et al.--;
"Yim" should be --Yim et al.--;
"Saton" should be --Saton et al.--.

Col. 1, line 16, after "N-substrate" insert --,--.
Col. 2, line 13, "comprise" should be --comprises--; delete "of";
line 14, "S, and;" should be --S; and--;
line 17, delete "THE";
line 18, "DRAWINGS" should be --PREFERRED EMBODIMENT--;
line 26, "fieldeffect" should be --field-effect--;
line 32, after "respectively" insert --,--;

Col. 3, line 35, "can not" should be --cannot--;
line 46, "latch-up" should be --latchup--.
Col. 4, line 16, "twoinput" should be --two-input--;
line 31, after "position" delete ",";
line 63, after "such" insert --second--.

UNITED STATES PATENT AND TRADEMARK OFFICE
CERTIFICATE OF CORRECTION

PATENT NO. : 4,288,804

DATED : 8 September 1981

INVENTOR(S) : HIDEO KIKUCHI et al.

It is certified that error appears in the above—identified patent and that said Letters Patent is hereby corrected as shown below:

```
Col. 5, line 13, "p+" should be --P+--;
        line 16, delete ",";
        line 20, "is and" should be --and--.
Col. 6, line 11, after "of" insert --a--.
Col. 9, line 20, after "6" insert --,--.
Col. 10, line 13, delete ",";
         lines 14, 15, & 18, "MOSFET's" should be
     --MOSFETs--;
         line 19, "FET's" should be --FETs--.
```

Signed and Sealed this

Sixteenth Day of March 1982

[SEAL]

Attest:

Attesting Officer

GERALD J. MOSSINGHOFF

Commissioner of Patents and Trademarks